United States Patent [19]
van Tran

[11] Patent Number: 4,645,952
[45] Date of Patent: Feb. 24, 1987

[54] HIGH SPEED NOR GATE

[75] Inventor: Hiep van Tran, Carrollton, Tex.

[73] Assignee: Thomson Components-Mostek Corporation, Carrollton, Tex.

[21] Appl. No.: 797,546

[22] Filed: Nov. 14, 1985

[51] Int. Cl.[4] .................. H03K 19/01; H03K 19/013
[52] U.S. Cl. ................................ 307/448; 307/450; 307/451; 307/468; 307/469
[58] Field of Search .......................... 307/448–451, 307/454–459, 468–469

[56]  References Cited
PUBLICATIONS

I.B.M. Technical Disc. Bul. vol. 19, No. 7, Dec. 1976, p. 2632, "Optimized Gate Size for FET Random Logic".

Primary Examiner—John S. Heyman
Assistant Examiner—M. R. Wambach
Attorney, Agent, or Firm—Roland Plottel

[57] ABSTRACT

A high speed CMOS NOR gate employs a pair of cross-coupled inverters and a dual set of N-channel pulldown transistors (202, 203) at each of the nodes between the two inverters, together with small pullup transistor (205) on the output terminal that is permanently energized and a switchable large pullup transistor (220) that is a link between the second inverter output and the first inverter input.

2 Claims, 2 Drawing Figures

HIGH SPEED NOR GATE

DESCRIPTION

1. Technical Field

The field of the invention is that of CMOS integrated circuits.

2. Background Art

Conventional NOR gates include a series connection of P-Channel transistors connected between Vcc and the output node and a parallel combination of N-Channel transistors connected between the output node and ground. The series connection of transistors slows down the transitions required of the NOR gate.

Disclosure of Invention

The invention relates to a high speed NOR gate that does not use the series connection of P-Channel transistors of the prior art but uses a pair of cross-coupled inverters and a dual set of N-Channel pulldown transistors at each of the nodes between the two inverters.

A feature of the invention is the use of a set of relatively large N-Channel transistors for pulldown and a single relatively large P-Channel transistor for pullup.

Another feature of the invention is the use of a non-standard trip point of an inverter to control the time at which a signal is generated.

BEST MODE OF CARRYING OUT THE INVENTION

Figure 1:
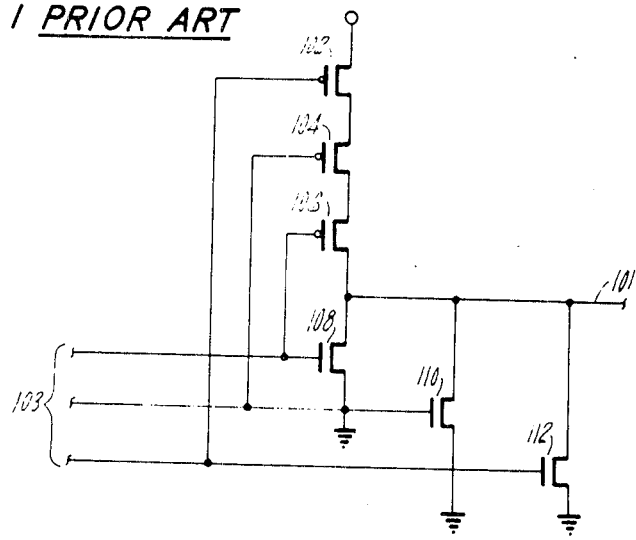
FIG. 1 illustrates a prior art NOR gate.

The conventional NOR gate of FIG. 1 responds to a set of inputs indicated collectively by the bracket labelled 103, three of which are illustrated. A conventional series of P-Channel transistors 102, 104, and 106 is connected between Vcc and the output node 101. A conventional set of N-Channel pulldown transistors 108, 110 and 112 is connected in parallel. In operation, the inputs 103 are normally low and the output node 101 is normally high. When any one signal goes high, a corresponding N-Channel transistor is turned on and the corresponding P-Channel transistor is turned off, forcing output node 101 to a low voltage without the need for a conflict between the P-Channel and the N-Channel transistors.

Figure 2:
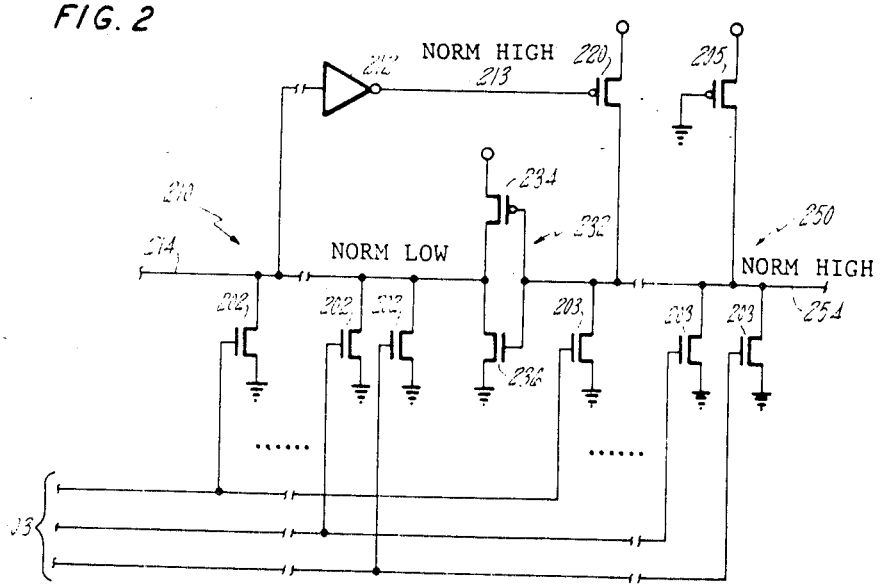
FIG. 2 illustrates a NOR gate constructed according to the invention.

Referring now to FIG. 2, there is shown a circuit constructed according to the invention, in which the same input lines 103 are connected to two sets of N-Channel transistors, indicated by the numerals 202 and 203 respectively. The pulldown transistors 202 are connected between ground and an intermediate node 214 that is in the portion of the circuit labeled by the numeral 210. The pulldown transistors 203 are connected between ground and the output node 254 in a portion of the circuit denoted by the numeral 250. Output node 254 is maintained at a normally high level by pullup transistor 205, a P-Channel transistor of relatively small current capacity that maintains node 254 in its default state of a high voltage. The switching action is provided by a pair of cross-coupled inverters, 232 and 212. Inverter 232 has an input connected to node 254 and an output node 214. Inverter 212 has an input at node 214 and an output at node 213 which is the gate of a relatively large channel width size P-Channel pullup transistor 220 that is connected between Vcc and node 254.

The voltage transitions of output node 254 are controlled by either transistor 220, which pulls node 254 from a low value to Vcc, or by transistors 203, which pull from the high value to a value near ground. The channel dimensions of transistors 203 will be selected together with the channel dimensions of transistor 205 such that the voltage on node 254 when both transistor 205 and one of transistors 203 are on will be in the conventional range for a logic zero. The large channel width size of transistors 203 has the advantage that the effect of transistor 205 will rapidly be overcome and there will be a fast transistion to a logic zero state.

The normal state of the circuit is: output node 254 is high, maintained by transistor 205. The input to inverter 232 being high, the output will be low at node 214. Inverter 212 will have its input, at node 214, low and its output at node 213 normally high. Switching transistor 220, having a normally high input will be normally off. In this steady state, there is no DC path between Vcc and ground so there is no steady state current being drawn.

In operation, one of lines 103 switches from a normally low state to a high state, starting to turn on a transistor 202 and also a transistor 203. Since transistor 203 has a channel width size sufficiently large to overcome transistor 205 easily, output node 254 switches to a low state quickly. Intermediate node 214 is normally low, which is the effect that transistor 202 is tending to reinforce, so that the time required to turn on transistor 202 is not critical. When the input to inverter 232 passes below its trip point, it will start to change its output state and P-Channel transistor 234 within inverter 232 will start to conduct, tending to pull node 214 to a logic high state. The final voltage on node 214 will result from the conflict between transistor 234 and transistor 202, resulting in an intermediate voltage on node 214 that will be referred to as $V_{214}$. The relative channel dimensions of transistors 234 and 202 will be arranged, as is well known to those skilled in the art, such that $V_{214}$ is less than the standard trip voltage of inverter 212. Thus, the state of inverter 212 does not change and intermediate node 213 remains in its normally high state and pullup transistor 220 remains turned off.

So long as one of input lines 103 is high, the circuit remains in this alternate state, in which output node 254 is low, at a value within the permitted range for logic zero, node 214 is at $V_{214}$ which is below a standard trip point for inverter 212 and also in the permitted range for logic zero. If more than one of lines 103 is high, then two or more of transistors 202 may be turned on and the value of node 214 will be less than $V_{214}$ because there is a lower impedance path to ground then was assumed for the case when only one transistor 202 is turned on. The circuit will thus be unaffected by having two or more of lines 103 active.

When the last of lines 103 reverts to its normally low state, both transistors 202 and 203 start to turn off. The trip point of inverter 232 is set, as is known to those skilled in the art, at a higher than usual voltage. A typical example is a trip point voltage of three quarters of the power supply voltage for inverter 232. As nodes 254 and node 214 start to rise in voltage, transistor 234 will continue to pull node 214 up in voltage as transistor 202 is turned off until the standard trip point of inverter 232 is reached. Since the voltage on node 214 was already above zero volts because of the effect of transistor 234, the trip point of inverter 212, will be reached and inverter 212 will switch states before inverter 232 does. There is thus a short period of time in which node 214 rises above the trip point of inverter 212 before inverter 232 pulls it down. Node 213 then drops in value when inverter 212 switches, turning on pullup transistor 220. The large current capacity of transistor 220 quickly pulls output node 254 back to its normally high state, reinforcing the action of transistor 205. In so doing, it necessarily crosses the trip point of inverter 232. When that happens, the turn-off of transistor 234 is completed and transistor 236 pulls node 214 back to its normally low value. When node 214 is pulled down below the trip point of inverter 212, it switches and intermediate node 213 begins to rise to its normally high value. As it does so, transistor 220 begins to turn off. Transistor 220 has already done its work however, by pulling node 254 up past the trip point of inverter 232. Since the trip point of inverter 232 is relatively close to Vcc, it is simple for the permanent pull up transistor 205 to finish restoring the voltage on node 254 to the full value of Vcc. There will be no significant effect on circuits connected to this NOR gate from the switch from transistor 220 to transistor 205 because transistor 220 does not turn off until node 254 has passed the standard value of a trip point for any circuit to be connected to this particular circuit.

Those skilled in the art will appreciate that the principles of the invention may be applied to circuits having a logic one as either ground or a finite voltage. Further, the supply voltage labelled Vcc in the drawings may be either positive or negative, with appropriate changes in the transistor type: N-channel or P-channel; enhancement or depletion. In order to express the following claims conveniently, the term "current supply terminal" will mean either ground or a voltage supply terminal that may be either positive or negative. Similarly, a "pulling" transistor will be either a pullup or pulldown transistor, as is appropriate to correspond to the voltage level in question. A "pulling means" will mean either a transistor or resistor. Although the circuit in the figures is CMOS, in order to take advantage of the low power consumption that CMOS offers, the invention could be implemented in NMOS or PMOS, with appropriate transistor type. The term "current capacity" refers to the amount of current that a device will source or sink.

I claim:

1. A NOR gate comprising at least two input terminals, a first group of transistors of predetermined type, each having a first current capacity, and a second group of transistors, each having a second current capacity, in which;

each of said at least two input terminals is connected to one of the gates of the transistors of said first group and also to one of the gates of the transistors of the second group;

said first group of transistors is connected in parallel between an output node; and a first current supply terminal; and said output node has pulling means, having a predetermined pulling means current capacity connected thereto, for maintaining said output node in a default voltage state;

said second group of transistors, having said predetermined type, are connected in parallel between an intermediate node and said first current supply terminal;

a first inverter, having a first inverter trip point, is connected between said output node and said intermediate node, with a first inverter input connected to said output node and a first inverter output connected to said intermediate node said first inverter having a first inverter pulling current capacity at its output;

a second inverter, having a second inverter trip point, a second inverter input and a second inverter output, has said second inverter input connected to said intermediate node;

a pulling transistor, having a pulling current capacity, is connected between a second current supply terminal and said output node, with a pulling gate connected to said second inverter output, said first current capacity, second current capacity, pulling means current capcity and first inverter pulling current capacity being related to one another and to said first and second inverter trip points by the conditions that:

said first current capacity is sufficiently greater than said pulling means current capacity that, when both said pulling means and one of said first group of transistors are conductive, the voltage on said output node is closer to the voltage of said first current supply terminal, and larger than the voltage at which the firt inverter trip point occurs; and said second current capacity is sufficiently greter than said first inverter pulling capacity that, when one of said second group of transistors and said first inverter are pulling toward opposite current terminals, the voltage on said intermediate node is closer to the voltage of said first current supply terminal than the voltage at which said second trip point occur, whereby, when a signal on one of said at least two input terminals activates one transistor of each of said first and second groups of transistors, said output node switches from said default voltage state to an opposite voltage state and both of said first and second inverters remain in a first and second normal inverter state.

2. A NOR gate according to claim 1, in which said predetermined type is N-channel enhancement; said pulling transistor is a P-channel enhancement transistor; said first current supply terminal is a ground terminal; and said second current supply terminal is a positive power supply terminal.

* * * * *